(12) United States Patent
Karnes

(10) Patent No.: US 6,600,642 B1
(45) Date of Patent: Jul. 29, 2003

(54) METHOD AND APPARATUS FOR LIGHTNING SUPPRESSION IN A TELECOMMUNICATION PRINTED CIRCUIT BOARD

(75) Inventor: Joshua D. Karnes, Leander, TX (US)

(73) Assignee: Cisco Technology, Inc., San Jose, CA (US)

( * ) Notice: Subject to any disclaimer, the term of this patent is extended or adjusted under 35 U.S.C. 154(b) by 341 days.

(21) Appl. No.: 09/751,754

(22) Filed: Dec. 29, 2000

(51) Int. Cl.[7] .............................. H01C 7/12; H02H 1/00
(52) U.S. Cl. ........................................ 361/119; 361/111
(58) Field of Search .................................. 361/111, 112, 361/119, 130, 751, 760, 765, 772, 777, 799, 800, 816, 818; 174/34, 35 R, 36, 140 R, 140 GR, 250, 253, 261

(56) References Cited

U.S. PATENT DOCUMENTS

| | | | | |
|---|---|---|---|---|
| 4,586,105 A | * | 4/1986 | Lippmann et al. | 361/117 |
| 4,942,400 A | * | 7/1990 | Tarzaiski et al. | 341/155 |
| 5,841,202 A | * | 11/1998 | Noguchi et al. | 307/10.1 |
| 6,493,198 B1 | * | 12/2002 | Arledge et al. | 361/56 |

* cited by examiner

*Primary Examiner*—Ronald W. Leja
(74) *Attorney, Agent, or Firm*—Baker Botts L.L.P.

(57) ABSTRACT

A method for lightning protection in a printed circuit board includes providing a printed circuit board having a plurality of conductors for connecting to a plurality of telecommunications lines, surrounding a portion of the conductors with a floating element to induce any lightning received by the conductors to flow to the floating element, and disposing a ground conductor with respect to a portion of the floating element such that lightning will be induced to flow to ground from the floating element.

35 Claims, 3 Drawing Sheets

METHOD AND APPARATUS FOR LIGHTNING SUPPRESSION IN A TELECOMMUNICATION PRINTED CIRCUIT BOARD

BACKGROUND OF THE INVENTION

Telecommunications circuits are typically interconnected using aerial cable strung between telephone poles. This type of installation results in telecommunications circuits which are susceptible to lightning strikes. For this reason, telecommunications equipment that might be connected to these lines must employ some method of resisting damage that may be caused by lightning surges entering the equipment by way of the telecommunications line. Various regulatory bodies, as well as telephone provider equipment standards, require this immunity be demonstrated in the form of a formal test report for this type of equipment.

Traditionally, surge immunity in telecommunications equipment is achieved by two primary methods: insulation (spacing) and use of surge-suppressor devices (gas tube, solid state, etc.).

The insulation method depends on an insulating barrier between the telecommunications circuitry in the equipment and other circuitry which may not be capable of withstanding lightning surge energy such as low-voltage logic, etc. The voltages which must be insulated are on the order of many thousands of volts, and therefore the insulation must be very thick in order to withstand these voltages. For a standard printed wiring board, 15 mm of spacing between conductors may be required.

As the industry moves towards miniaturization and requires more compact designs than are practical with the insulation method, the use of surge suppression devices has become commonplace. These devices are intended to intentionally break down at a particular low voltages and shunt this lightning energy safely to ground, thus protecting the more sensitive electronics in the device from high voltages. Devices like this are employed on each telecommunication-line conductor (tip and ring) where they enter into the equipment, connecting between tip and ring and ground.

In principle, any "spark gap", consisting of an energized conductor placed sufficiently close to a ground conductor, will function as a surge suppressor. At some voltage, depending on the distance between conductors, the insulation offered by air that separates these conductors is broken down, resulting in an arc. Current flows through this arc and the voltage is therefore held low.

Pressure to produce higher-density telecommunications equipment continues to push towards more compact designs. The limits of space and the size of surge suppression devices dictate the maximum density of telecommunications devices. The result is typically a balance of lightning immunity and miniaturization.

Surge suppression devices, while more compact than insulation, still have a limit to how compact they can be, which is defined in large part by the distance which must be present between their pins in order to provide insulation at voltages below their activating voltage. Also, there is a cost associated in procuring these components and placing them on a printed wiring board. In order to provide reliable surge suppression, each telecommunications line must be equipped with at least two of these suppressors, one for tip and one for ring. For example, for a 256-channel DSL Multiplexer, at least 512 of these devices must be employed in order to provide reliable lightning suppression. This is expensive in terms of space and cost.

Furthermore, the value in making one product which may be supplied to a global marketplace is high, and therefore a push is made to conform to requirements for all countries. Certain European and Australian requirements specify design constraints that appear to be at odds with this surge suppressor technique. One such requirement is that the device be capable of withstanding certain types of lightning strikes without any kind of breakdown. Another requirement is that telecommunication circuits do not employ suppressors connected to ground in order to achieve immunity.

These requirements tend to force equipment makers into either excluding these countries from their marketplace, into making different equipment for each marketplace, or into the use of the insulation method which is undesirable due to excessive space requirements.

SUMMARY OF THE INVENTION

Accordingly, a need has arisen for a method and apparatus for lightning suppression in a telecommunications printed circuit board. The present invention provides a method and apparatus for lightning suppression in a telecommunications circuit board that addresses shortcomings of prior systems and methods.

According to one embodiment of the invention, a printed circuit board includes at least one telecommunications circuit conductor operable to connect to a telecommunications line and a ground conductor for electrically grounding the printed circuit board. The printed circuit board also includes at least one other conductor to be protected from lightning and a floating element electrically floating and disposed proximate the telecommunications circuit conductor and also disposed proximate the ground conductor. The floating element is operable to induce a lightning charge to flow to the ground conductor through the floating element and not flow to the at least one other conductor.

According to another embodiment of the invention, a method for lightning protection for a printed circuit board includes providing a printed circuit board having a plurality of conductors for connecting to a plurality of telecommunications lines, surrounding a portion of the conductors with a floating element to induce any lightning received by the conductors to flow to the floating element, and disposing a ground conductor with respect to a portion of the floating element such that lightning will be induced to flow to ground from the floating element.

Embodiments of the invention provide numerous technical advantages. For example, some embodiments of the invention allow lightning protection is a printed circuit board having a plurality of conductors susceptible to lightning. Such lightning protection may be achieved in a low-cost manner by providing a floating element at an appropriate location on the printed circuit board that satisfies pertinent regulations while achieving lightning protection. Such lightning protection results in more reliable printed circuit boards that comply with pertinent regulatory body standards. Additionally, printed circuit boards according to the teachings of the invention reduce risk to users who are normally exposed to low voltage signals, but do not expect to come into contact with high voltage signals.

Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE INVENTION

Embodiments of the present invention and its advantages are best understood by referring to FIGS. 1 through 6 of the drawings, like numerals being used for like and corresponding parts of the various drawings.

Figure 1:
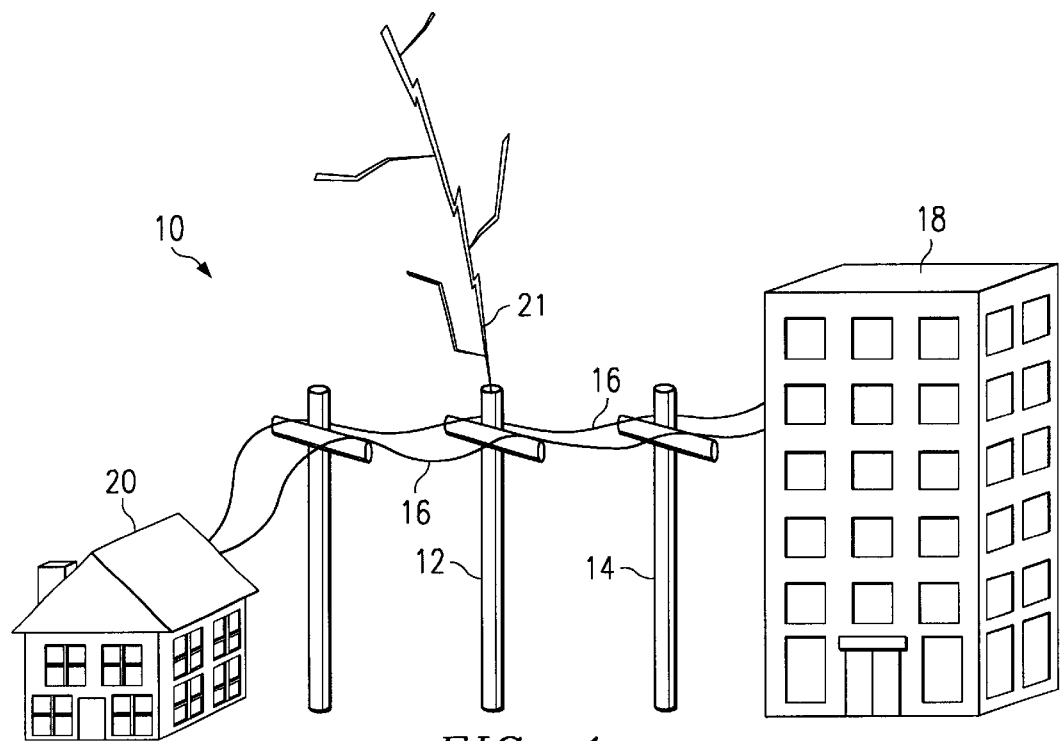
FIG. 1 is a schematic diagram of a system susceptible to lightning.

FIG. 1 is a schematic diagram showing a system 10 susceptible to lightning. System 10 includes a plurality of telephone poles 12, 14 supporting telephone wires 16. Telephone wires 16 connect, in this example, a telecommunications central office 18 to a user's home 20. Telephone poles 12, 14 and telephone wires 16 are susceptible to lightning 22. Thus, a lightning strike in an area of system 10 can result in a lightning charge being transmitted along telephone wires 16 to either home 20 or central office 18.

The invention addresses problems associated with receiving lightning strikes due to the transmission of lightning strikes to telecommunications equipment. The following figures and associated description describe the invention in the context of telecommunications equipment stored in central office 18; however, similar equipment utilizing the teachings of the present invention also could be utilized at home 20 or other location susceptible to lightning.

Figure 2:
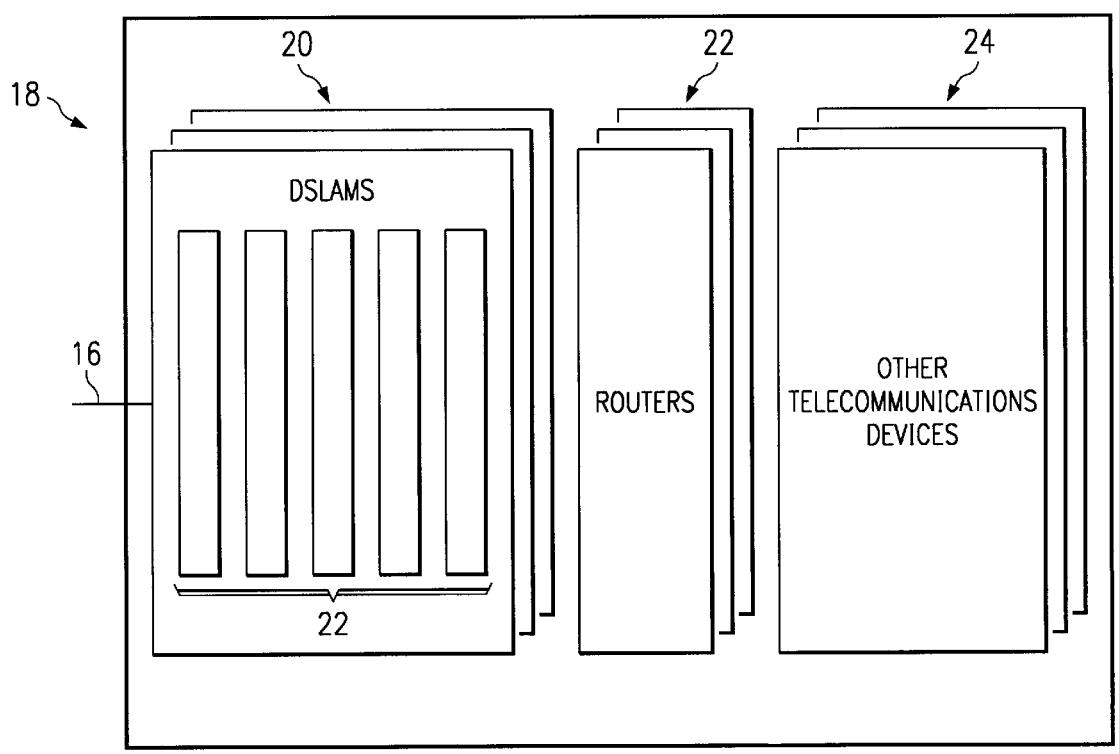
FIG. 2 is a block diagram of a telecommunications central office showing a plurality of devices susceptible to lightning.

FIG. 2 is a block diagram showing various telecommunications components that may be stored in central office 18. As shown, central office 18 is connected to telephone wires 16. In this example, central office 18 includes a plurality of DSLAMs 20 (digital subscriber line access multiplexers), a plurality of routers 22, and a plurality of other telecommunications devices 24. For purposes of description of the present invention, DSLAMs will be used as an example of a telecommunications device that is susceptible to lightning. DSLAMs 20 include a plurality of printed circuit boards 22 used to implement functions of the DSLAM. For example, printed circuit boards 22 may include a DSL modem for receiving and transmitting information over telecommunication lines 16. Additional details of one of the modems 22 showing teachings of the invention, are illustrated in FIG. 3.

Figure 3:
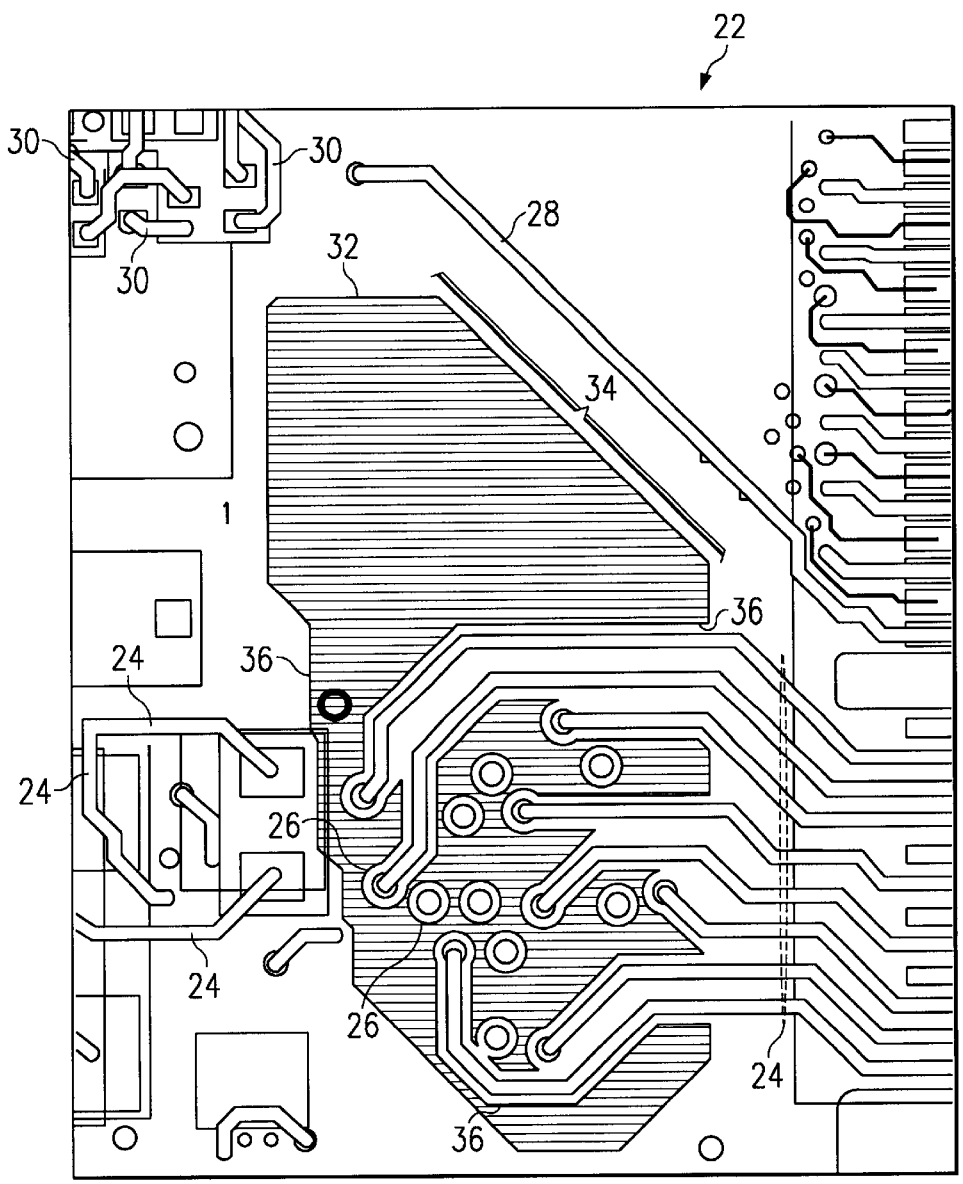
FIG. 3 is a schematic of a printed circuit board of FIG. 2 having lightning suppression circuitry according to the teachings of the invention.

FIG. 3 is a block diagram of a portion of the printed circuit board 22 of FIG. 2. Because printed circuit board 22 is connected to telecommunications line 16, it is susceptible to lightning. Printed circuit board 22 in this example is a DSL modem; however, any printed circuit board that receives lines susceptible to lightning may incorporate the teachings of the invention. Other types of printed circuit boards that may be susceptible to lightning, in addition to DSL modems, include voice telephone switches, T-1 interfaces, ATM switches, and others. Printed circuit board 22 includes a plurality of telecommunications circuit conductors 24. Telecommunications circuit conductors 24 may include pairs of tip and ring conductors associated with telephone lines. Four such pairs are shown in FIG. 3. Telecommunications circuit conductors 24 are used to couple printed circuit board 22 to telephone lines 16. In this embodiment, each telecommunications circuit conductor 24 includes at least one via 26; however, such vias may be omitted in other embodiments. Vias 26 allow transmission of electrical current along conductor 24 from one side or layer of printed circuit board 22 to another side or layer.

Printed circuit board 22 also includes a ground trace, or ground conductor 28. Ground conductor 28 is used to provide an electrical ground to printed circuit board 22 and may be connected to such an electrical ground. Ground trace 28 may include points or teeth to encourage arcing to the ground trace. Generally, arcing is more likely to occur where a high charge concentration may accumulate, which generally corresponds to configurations with points or teeth. In addition, in this embodiment, ground trace 28 is designed to have a low impedance to provide as low an impedance path to ground as possible in order to encourage lightning to flow to ground rather than to non-telecommunications conductors 30 (described below).

Printed circuit board 22 also includes a plurality of non-telecommunications conductors 30 used to transmit electrical signals throughout printed circuit board 22. Non-telecommunications conductors 30 are non-telecommunications conductors because they are not formed to address electrical power surges, such as by utilizing fuses, transformers, or voltage suppressors. Other non-telecommunications conductors 30 that may come into close proximity with telecommunications circuit conductors 24 on other portions of printed circuit board 22 are not explicitly shown in FIG. 3, but examples of such conductors are described in conjunction with FIG. 4. Non-telecommunications conductors 30 may also be referred to as low voltage circuit conductors.

When lightning strikes telephone line 16, a lightning charge flows to telecommunications circuit conductors 24. This charge has a tendency to arc to the non-telecommunications conductors 30, resulting in destruction of the majority of the circuitry of printed circuit board 22. Therefore, it is desirable to isolate such charge to only telecommunications lines 24. According to the teachings of the invention, this is achieved by providing a floating element 32 proximate telecommunications circuit conductors. In addition, floating element 32 is disposed appropriately close to ground trace 28. By locating floating element 32 in such a manner, lightning received by telecommunication circuit conductors 24 is induced to flow to floating element 32. This charge is induced to arc to ground trace 28 due to the proximity of ground trace 28 to floating element 32. The teachings of the invention recognize that lightning may tend to arc from any one of the plurality of telecommunications circuit conductors to low voltage circuit conductors and therefore all relevant telecommunications circuit conductors are placed in proximity to floating element 32.

Floating element 32 is floating because it is not connected electrically to any electrical potential. Floating element 32 may be formed of any suitable conductive material; however, in this embodiment floating element 32 is formed from copper, the same material as the other traces formed on printed circuit board 22. Floating element 32 may be fabricated using standard computer assisted design techniques. Generally, in this embodiment, floating element 32 is designed to provide maximum exposure to ground trace 28, as indicated by the area denoted by arrow 34. In addition, the performance of floating element 32 is enhanced by reducing its impedance. In other words, lightning will be more likely to flow through floating element 32 than to any of the non-telecommunications conductors 30 if its resistance to electrical flow, or impedance, is decreased. One way of doing this is to design floating element as wide as practical. In this embodiment, floating element 32 has the same thickness as the other traces on printed circuit board 22; however, it may be formed with a different thickness if desired.

In the example shown, floating element 32 is a plane trace. This serves a number of functions. First, by being formed as a plane trace, floating element 32 can be oriented close to each of the telecommunications circuit conductors 24 to induce arcing from the telecommunications conductor 24 to floating element 32. In the example illustrated, the distance between the telecommunications circuit conductors and the floating element 32 is approximately 0.015 inches and the distance between floating element 32 and the ground trace is approximately 0.115 inches. As described in greater detail below in conjunction with FIG. 4, forming floating element 28 at such distances from telecommunications circuit conductors 24 and ground trace 28 complies with relevant standards but at the same time induces any lightning received by telecommunications circuit conductors 24 to arc to ground through floating element 32 rather than to other non-telecommunications conductors 30 on printed circuit board 28. During construction the edges 36 of floating element 32 may be exposed so that any arc to or from floating element 32 occurs through air rather than through the printed circuit board insulator.

Figure 4:
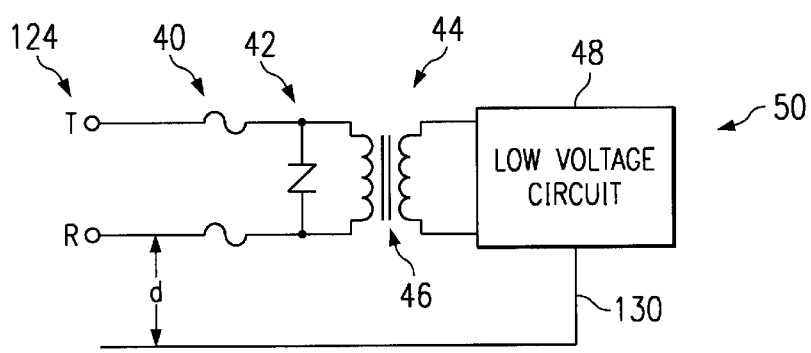
FIG. 4 is a circuit diagram showing isolation of low voltage circuitry from high voltage circuitry in the printed circuit board of FIG. 2.

FIG. 4 is a circuit diagram illustrating a typical circuit that may be formed on printed circuit board 22 that is illustrative of the potential problem of arcing from a telecommunications circuit conductor such as conductors 24, to a non-telecommunications conductor, such as conductors 30. As shown in FIG. 4, circuit 50 includes two telecommunications circuit conductors 124, represented by tip and rig nodes. Generally, telecommunications circuit conductors 124 may receive high voltages. By contrast, a low-voltage circuit 48 on printed circuit board 22 is not designed to receive high voltages. Therefore, signals on telecommunications circuit conductors 24 must be transferred to low-voltage circuit 48 without a direct electrical connection.

This transfer is achieved by transformer 44 according to well-known techniques. As a barrier to avoid high voltages on telecommunications circuit conductors 24 from reaching low-voltage circuit 48, both a fuse 40 and a voltage suppressor 42 are provided between telecommunications conductor 24 and low-voltage circuit 48. In addition, a capacitor 46 associated with transformer 44 helps form a barrier between low-voltage circuitry 48 and telecommunications circuit conductors 24. However, although a fuse 40, a voltage suppressor 42, and transformer 44 provide some protection against high-voltage surges reaching the low-voltage circuit 48, low-voltage circuit 48 remains susceptible to lightning and other high-voltage surges. For example, non-telecommunications conductor 130, which leads to low-voltage circuit 48 and is designed to receive only low voltages, may be printed on printed circuit board 22 a distance d from one of the telecommunications circuit conductors 24. If this distance d is too small, lightning or other high voltage may arc from telecommunications circuit conductor 24 to non-telecommunications conductor 30, resulting in low-voltage circuit 48 receiving undesired high voltages.

As described in conjunction with FIG. 3, the use of floating element 32 address this problem of arcing between low and high voltage lines by providing a lower impedance path to ground than the impedance between telecommunications conductor 130 and conductor 124. Additional factors that may be considered in designing such a floating element are described in conjunction with FIG. 5.

Figure 5:
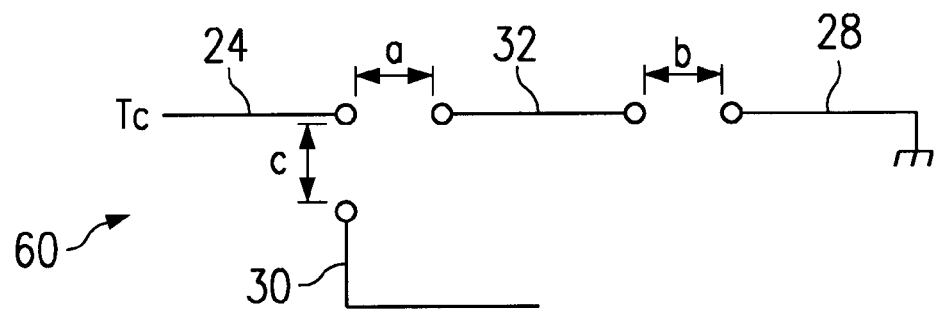
FIG. 5 is a circuit schematic showing appropriate distances for spacing of the various conductors of printed circuit board of FIG. 3 according to one embodiment of the invention.

FIG. 5 is a circuit diagram showing distances associated with placement of floating element 32 with respect to ground trace 28 and with respect to telecommunications circuit conductors 24, according to the teachings of the invention. As illustrated, telecommunications circuit conductors 24 are separated from floating element 32 by a distance a. As described above, distance a is 0.015 inches in this embodiment; however, other suitable distances may be used. This short distance is utilized in this embodiment to encourage arcing to floating element 32, while retaining electrical isolation during normal operation and meeting minimum spacing requirements between conductors. Floating element 32 is separated from ground trace 28 by a distance b. According to some standards and regulations, the total distance a+b must not fall below 0.130 inches. Therefore, in this example, distance b is 0.115 inches, resulting in a total distance of a and b being 130 mm.

According to the teachings of the invention, the distance c between telecommunications circuit conductor 24 and a non-telecommunications circuit conductor 30 should exceed the total distance of a plus b. Therefore, in this embodiment, distance c exceeds 0.130 inches to induce any lightning on telecommunications circuit conductors 24 to arc to floating element 32 to ground trace 28, rather than from telecommunications circuit conductor 24 to non-telecommunications conductor 30.

Figure 6:
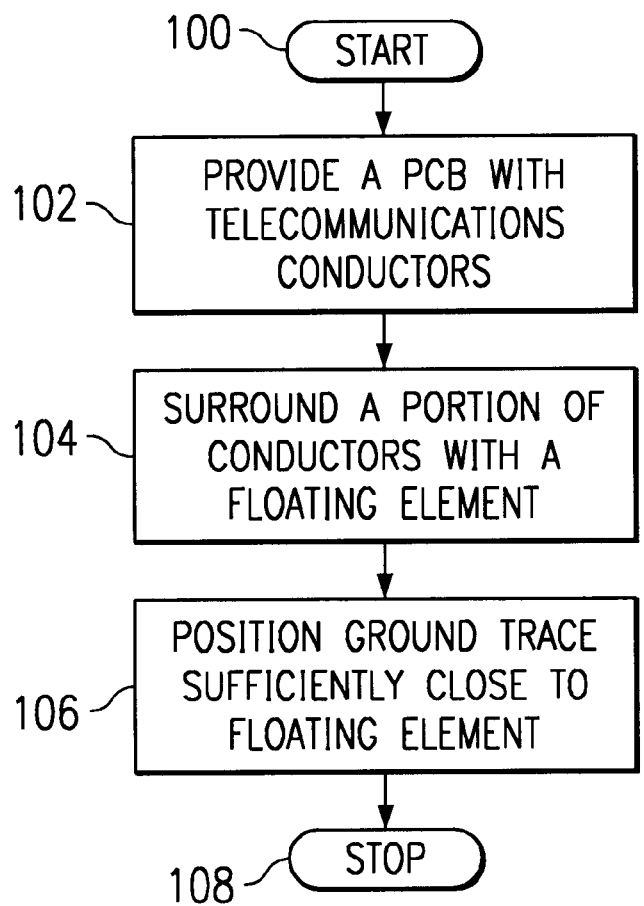
FIG. 6 is a flow chart showing one embodiment of a method for suppressing lightning in a telecommunications printed circuit board.

FIG. 6 is a flow chart illustrating a method for suppressing lightning in printed circuit board devices. The method begins at step 100. At step 102, a printed circuit board is provided with conductors susceptible to high voltages. As described above, such conductors may be telecommunications conductors designed to receive telecommunication lines. In other embodiments, such conductors may be conductors designed to receive power lines or other potentially high-voltage signals.

At a step 104, relevant portions of the plurality of conductors provided at step 102 are surrounded with a floating element such that high voltages received on the conductors are induced to arc to the floating element rather than to some other location. At step 106, a ground trace is positioned sufficiently close to the floating element to induce lightning to arc from the floating element to the guard trace rather than arcing to a conductor associated with a low-voltage circuit. Steps 104 and 106 may occur concurrently.

Details associated with each of these steps are described above in conjunction with FIGS. 3 through 5 for one embodiment of the invention; however, other suitable implementations of this method are within the scope of the present invention. In this manner, lightning striking a telecommunications line or other line susceptible to high voltages may be suppressed on a printed circuit board while adhering to relevant design regulations affecting spacing in printed circuit boards. This results in a more reliable printed circuit board while complying with relevant standards. Furthermore, such a printed circuit board reduces risk to users who are normally exposed to low voltages, but do not expect to come into contact with high-voltage surges.

Although the present invention and its advantages have been described in detail, it should be understood that various changes, substitutions, and alterations can be made therein without departing from the spirit and scope of the present invention as defined by the appended claims.

What is claimed is:

1. A printed circuit board comprising:
   at least one telecommunications circuit conductor operable to connect to a telecommunications line;
   a ground conductor for electrically grounding the printed circuit board;
   at least one other conductor to be protected from lightning; and
   a floating element electrically floating and disposed proximate the telecommunications circuit conductor and also disposed proximate the ground conductor, the floating element operable to induce a lightning charge to flow to the ground conductor through the floating element and not flow to the at least one other conductor.

2. The printed circuit board of claim 1, wherein the combined shortest distance between the telecommunications circuit conductor and the floating element and the ground conductor is less than the shortest distance between the at least one telecommunications conductor and the any other conductor.

3. The printed circuit board of claim 1, wherein the floating element comprises a plane trace.

4. The printed circuit board of claim 1, wherein the floating element is formed from copper.

5. The printed circuit board of claim 1, wherein the shortest distance between the floating element and the at least one telecommunications circuit conductor is 0.015 inches.

6. The printed circuit board of claim 1, wherein the at least one telecommunications circuit comprises a plurality of vias disposed proximate the floating element.

7. The printed circuit board of claim 1, wherein the at least one telecommunications circuit comprises a plurality of conductors and wherein the floating element is disposed proximate the plurality of conductors.

8. The printed circuit board of claim 1, wherein the shortest distance between the floating element and the ground conductor is approximately 0.115 inches.

9. The printed circuit board of claim 2, wherein the combined distance is approximately 0.130 inches.

10. The printed circuit board of claim 1, wherein the at least one telecommunications circuit conductor is connected to at least one telecommunications line.

11. A printed circuit board comprising:
    a plurality of telecommunications conductors operable to connect to a plurality of respective telecommunications lines, the plurality of telecommunications conductors comprising all telecommunications conductors on the printed circuit board;
    a ground conductor operable to electrically ground the printed circuit board; and
    a floating element electrically floating and disposed such that the sum of the shortest distance between the floating element and any one of the plurality of telecommunications conductors and the shortest distance from the floating element to ground is sufficiently short to induce any lightning received by any one of the plurality of telecommunications conductors to flow to the ground conductor through the floating element.

12. The printed circuit board of claim 11, wherein the plurality of telecommunications conductors comprises a plurality of telecommunications conductors each having a respective via.

13. The printed circuit board of claim 12, wherein the floating element is disposed proximate each of the vias.

14. The printed circuit board of claim 11, wherein the floating element is approximately 0.015 inches from each of the telecommunications conductors.

15. The printed circuit board of claim 11, wherein the shortest combined distance between any one of the telecommunications conductors and the floating element and between the floating element and the ground conductor is less than the shortest distance between any one of the telecommunications conductors and any non-telecommunications conductor on the printed circuit board.

16. The printed circuit board of claim 11, wherein the floating element is formed from copper.

17. The printed circuit board of claim 11, wherein the shortest distance between the floating element and the ground conductor is approximately 0.115 inches.

18. The printed circuit board of claim 17, wherein the shortest distance between the floating element and any one of the plurality of telecommunications conductors is 0.015 inches.

19. A method for lightning protection for a telecommunication printed circuit board, the method comprising:
    providing a printed circuit board having a plurality of conductors for connecting to a plurality of telecommunications lines;
    surrounding a portion of the conductors with a floating element to induce any lightning received by the conductors to flow to the floating element; and
    disposing a ground conductor with respect to a portion of the floating element such that lightning will be induced to flow to ground from the floating element.

20. The method of claim 19, wherein providing a printed circuit board having a plurality of conductors comprises providing a printed circuit board having a plurality of conductors each having an associated via.

21. The method of claim 20, wherein surrounding a portion of the conductors with a floating element comprises surrounding a portion of the conductors with a floating conductive plane.

22. The method of claim 21, wherein, for each of the conductors, the shortest distance between the floating element and the conductor is approximately 0.015 inches.

23. The method of claim 19, wherein the floating element comprises a floating plane.

24. The method of claim 23, wherein disposing a ground conductor proximate to a portion of the floating element comprises disposing a ground conductor approximately 0.115 inches from the portion of the floating element.

25. The method of claim 19, wherein the floating element comprises copper.

26. The method of claim 19, and further comprising connecting the plurality of conductors to the plurality of telecommunications lines.

27. The method of claim 19, wherein surrounding a portion of the conductors with a floating element comprises surrounding a portion of the conductors with a floating plane formed from copper.

28. A printed circuit board comprising:
    a telecommunications conductor means for connection to a plurality of the telecommunications lines;
    a ground conductor means for connection to electrical ground;

a non-telecommunications conductor means for carrying current in the printed circuit board; and a floating plane means for inducing any lightning on the telecommunications conductor means to flow from the telecommunications means to the ground conductor means and not flow to the non-telecommunications conductor means.

29. A method for lightning protection for a printed circuit board, the method comprising:

providing a printed circuit board having a plurality of conductors for connecting to a plurality of high voltage lines;

surrounding a portion of the conductors with a floating element to induce any lightning received by the conductors to flow to the floating element; and disposing a ground conductor with respect to a portion of the floating element such that lightning will be induced to flow to ground from the floating element.

30. The method of claim 29, wherein providing a printed circuit board having a plurality of conductors comprises providing a printed circuit board having a plurality of conductors each having an associated via.

31. The method of claim 30, wherein surrounding a portion of the conductors with a floating element comprises surrounding a portion of the conductors with a floating conductive plane.

32. The method of claim 31, wherein, for each of the conductors, the shortest distance between the floating element and the conductor is approximately 0.015 inches.

33. The method of claim 29, wherein the floating element comprises a floating plane.

34. The method of claim 33, wherein disposing a ground conductor proximate to a portion of the floating element comprises disposing a ground conductor approximately 0.115 inches from the portion of the floating element.

35. The method of claim 29, wherein the floating element comprises copper.

* * * * *

UNITED STATES PATENT AND TRADEMARK OFFICE
CERTIFICATE OF CORRECTION

| | | |
|---|---|---|
| PATENT NO. | : 6,600,642 B2 | Page 1 of 1 |
| APPLICATION NO. | : 09/751754 | |
| DATED | : July 29, 2003 | |
| INVENTOR(S) | : Joshua D. Karnes | |

It is certified that error appears in the above-identified patent and that said Letters Patent is hereby corrected as shown below:

Column 8,
Line 22, after "circuit board of claim", delete "17" and insert -- 11 --.

Signed and Sealed this

Twelfth Day of September, 2006

JON W. DUDAS
*Director of the United States Patent and Trademark Office*